United States Patent
Ivanov

(10) Patent No.: US 9,614,481 B2
(45) Date of Patent: Apr. 4, 2017

(54) APPARATUS AND METHODS FOR CHOPPING RIPPLE REDUCTION IN AMPLIFIERS

(71) Applicant: Analog Devices, Inc., Norwood, MA (US)

(72) Inventor: Evgueni Ivanov, Lexington, MA (US)

(73) Assignee: ANALOG DEVICES, INC., Norwood, MA (US)

( * ) Notice: Subject to any disclaimer, the term of this patent is extended or adjusted under 35 U.S.C. 154(b) by 0 days.

(21) Appl. No.: 14/675,087

(22) Filed: Mar. 31, 2015

(65) Prior Publication Data

US 2016/0294331 A1    Oct. 6, 2016

(51) Int. Cl.
  *H03F 1/26* (2006.01)
  *H03F 1/02* (2006.01)
  *H03F 3/393* (2006.01)

(52) U.S. Cl.
  CPC .............. *H03F 1/26* (2013.01); *H03F 1/0205* (2013.01); *H03F 3/393* (2013.01); *H03F 2200/249* (2013.01); *H03F 2200/375* (2013.01); *H03F 2200/78* (2013.01); *H03F 2203/7212* (2013.01)

(58) Field of Classification Search
  CPC .......... H03F 1/26; H03F 1/0205; H03F 3/393; H03F 3/45179
  USPC ...................................... 330/9; 327/124, 307
  See application file for complete search history.

(56) References Cited

U.S. PATENT DOCUMENTS

| | | | |
|---|---|---|---|
| 5,206,602 A | 4/1993 | Baumgartner et al. | |
| 6,262,626 B1 * | 7/2001 | Bakker | H03F 1/303 330/9 |
| 6,476,671 B1 | 11/2002 | Tang | |
| 6,509,777 B2 | 1/2003 | Razavi et al. | |
| 6,674,322 B2 * | 1/2004 | Motz | G01R 33/07 330/9 |

(Continued)

OTHER PUBLICATIONS

Wu et al., *A Chopper Current-Feedback Instrumentation Amplifier with a 1mHz 1/f Noise Corner and an AC-Coupled Ripple-Reduction Loop*, ISSCC 2009, IEEE International Solid-State Circuits Conference, Feb. 2009, 3 pages.

*Primary Examiner* — Khanh V Nguyen
(74) *Attorney, Agent, or Firm* — Knobbe, Martens, Olson & Bear LLP

(57) ABSTRACT

Apparatus and methods for digitally-assisted feedback offset correction are provided herein. In certain configurations, an amplifier includes amplification circuitry for providing amplification to an input signal and chopping circuitry for compensating for an input offset voltage of the amplifier. Additionally, the amplifier further includes a digitally-assisted feedback offset correction circuit, which includes a chopping ripple detection circuit, a feedback-path chopping circuit, a digital correction control circuit, and an offset correction circuit. The chopping ripple detection circuit generates a detected ripple signal based on detecting an output ripple of the amplifier. Additionally, the feedback-path chopping circuit demodulates the detected ripple signal using the amplifier's chopping clock signal. The digital correction control circuit receives the demodulated ripple signal, which the digital correction control circuit uses to control a value of a digital offset control signal that controls an amount of input offset correction provided by the offset correction circuit.

20 Claims, 7 Drawing Sheets

(56) References Cited

U.S. PATENT DOCUMENTS

| | | | |
|---|---|---|---|
| 6,734,723 B2 | 5/2004 | Huijsing et al. | |
| 7,132,883 B2 | 11/2006 | Huijsing et al. | |
| 7,209,000 B2 | 4/2007 | Huijsing et al. | |
| 7,292,095 B2 | 11/2007 | Burt et al. | |
| 7,382,183 B2 | 6/2008 | Nolan et al. | |
| 7,492,149 B2 * | 2/2009 | Motz | G01D 5/147 324/207.12 |
| 7,535,295 B1 | 5/2009 | Huijsing et al. | |
| 7,573,327 B1 | 8/2009 | Pertijs et al. | |
| 7,586,368 B2 | 9/2009 | Trifonov | |
| 7,724,080 B2 | 5/2010 | Luff | |
| 7,764,118 B2 * | 7/2010 | Kusuda | H03F 3/45977 330/9 |
| 8,120,422 B1 | 2/2012 | Huijsing et al. | |
| 8,179,195 B1 * | 5/2012 | Huijsing | H03F 3/38 330/9 |
| 8,358,164 B2 * | 1/2013 | Fant | H03C 1/06 327/307 |
| 8,786,363 B2 | 7/2014 | Ahmad | |
| 8,829,988 B2 * | 9/2014 | Motz | H03F 3/387 330/9 |
| 2009/0302923 A1 * | 12/2009 | Smeloy | H03F 3/45623 330/9 |

* cited by examiner

APPARATUS AND METHODS FOR CHOPPING RIPPLE REDUCTION IN AMPLIFIERS

BACKGROUND

Field

Embodiments of the invention relate to electronic devices, and more particularly, to amplifiers.

Description of the Related Technology

An amplifier, such as an operational or instrumentation amplifier, can include chopper circuitry to help compensate for the amplifier's input offset voltage. For example, a chopper amplifier can include an input chopping circuit that can be used to chop or modulate the amplifier's input signal during an input chopping operation, thereby up-shifting the frequency of the amplifier's input signal. Additionally, the chopper amplifier can include a filter for filtering the amplifier's input offset voltage, which can be separated in frequency from the chopped input signal. The chopper amplifier can further include an output chopping circuit for demodulating or down-shifting the frequency of the chopped input signal during an output chopping operation.

Although including chopper circuitry in an amplifier can reduce the amplifier's input offset voltage, configuring the amplifier in this manner can also generate ripples in the amplifier's output signal at the chopping frequency and at harmonics thereof.

SUMMARY

In one aspect, an amplifier includes amplification circuitry configured to generate an output signal based on amplifying a differential input voltage signal, chopping circuitry configured to provide chopping to the differential input voltage signal, and a feedback offset correction circuit. The feedback offset correction circuit includes a chopping ripple detection circuit configured to generate a detected ripple signal based on detecting a chopping ripple of the amplifier associated with the chopping, a feedback-path chopping circuit configured to generate a demodulated ripple signal based on chopping the detected ripple signal, a digital correction control circuit configured to generate a digital correction control signal based on the demodulated ripple signal, and an offset correction circuit configured to correct for an input offset voltage of the amplification circuitry based on a value of the digital correction control signal. The digital correction control circuit is controlled by a control clock signal.

In another aspect, a method of reducing a chopping ripple of an amplifier is provided. The method includes amplifying a differential input voltage signal to generate an output signal using amplification circuitry, chopping the differential input voltage signal using chopping circuitry, and compensating for an input offset voltage of the amplification circuitry using a feedback offset correction circuit. Compensating for the input offset voltage includes detecting the chopping ripple of the amplifier associated with the chopping to generate a detected ripple signal, demodulating the detected ripple signal to generate a demodulated ripple signal, generating a digital correction control signal based on the demodulated ripple signal and a control clock signal, and correcting the input offset voltage based on a value of the digital correction control signal such that the output ripple is reduced.

In another aspect, an amplifier includes amplification circuitry configured to generate an output signal based on amplifying a differential input voltage signal, chopping circuitry configured to provide chopping to the differential input voltage signal, and a feedback offset correction circuit. The feedback offset correction circuit includes an chopping ripple signal detection circuit configured to generate a detected ripple signal based on detecting an output chopping ripple of the amplifier associated with the chopping, a feedback-path chopping circuit configured to generate a demodulated ripple signal based on chopping the detected ripple signal, a means for generating a digital correction control signal based on the demodulated ripple signal and a control clock signal, and a means for correcting for an input offset voltage of the amplification circuitry based on a value of the digital correction control signal.

DETAILED DESCRIPTION OF EMBODIMENTS

Figure 1:
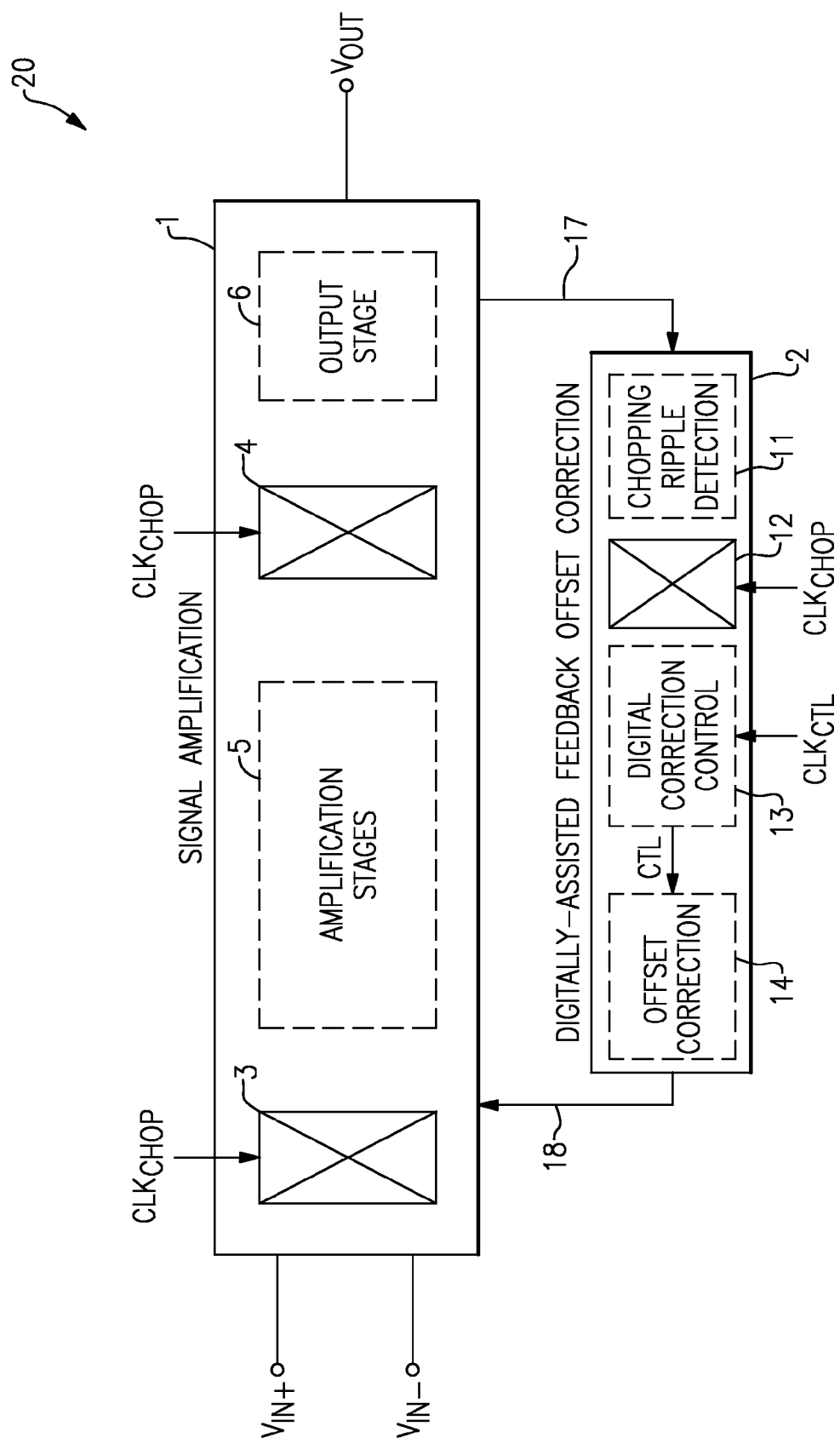
FIG. 1 is a schematic diagram illustrating one embodiment of a chopper amplifier with digitally-assisted feedback offset correction.

The following detailed description of certain embodiments presents various descriptions of specific embodiments of the invention. However, the invention can be embodied in a multitude of different ways as defined and covered by the claims. In this description, reference is made to the drawings in which like reference numerals may indicate identical or functionally similar elements.

Absent compensation, an amplifier can have an input offset voltage. The amplifier can also have flicker or 1/f noise, which can have an associated noise power spectral density (PSD) that becomes larger at lower frequencies.

To reduce or remove input offset voltage and/or flicker noise, an amplifier can include chopper circuitry. In one example, the chopper circuitry includes an input chopping circuit that chops or modulates the amplifier's input signal during an input chopping operation, thereby up-shifting the frequency of the amplifier's input signal. Furthermore, the chopper circuitry includes an output chopping circuit that demodulates or down-shifts the frequency of the chopped input signal during an output chopping operation.

In certain configurations, an amplifier can further include autozero circuitry. Including both autozero and chopper circuitry in an amplifier can further lower overall input offset voltage. The teachings herein are applicable not only to chopper amplifiers, but also to amplifiers that combine chopping with autozeroing and/or other input offset voltage compensation schemes.

An amplifier's chopping operations can result in modulated voltage ripples appearing at the amplifier's output. The modulated voltage ripples can have a magnitude that changes in relation to the magnitude of the amplifier's input offset voltage before chopping. Thus, chopping may result in the amplifier's input offset voltage not being cancelled, but instead being modulated up by the chopping frequency, thereby creating chopping ripples and corrupting the spectral integrity of the output signal.

Although a low-pass post filter can be used to filter output ripples associated with a modulated input offset voltage, it can be desirable to reduce the amplifier's input offset voltage to avoid a need for a post filter or to relax a design constraint of the post filter.

Feedback or feedforward offset correction paths can be used to suppress chopping ripples. However, certain feedback or feedforward offset correction paths can cause signal distortion by introducing anomalies in the amplifier's frequency response characteristics. For example, certain chopping ripple suppression schemes may result in the appearance of notches near the chopping frequency in a plot of the amplifier's gain versus frequency. Although an amplifier can be implemented to include a high-frequency signal compensation path to help compensate for such notches, the high-frequency signal compensation path may add complexity, increase power consumption, and/or not fully compensate for the notch. Furthermore, if an out-of-range signal is applied as an input to such an amplifier, the amplifier's loop may be disturbed and the amplifier may exhibit a relatively slow settling time.

Apparatus and methods for digitally-assisted feedback offset correction are provided herein. In certain configurations, an amplifier includes amplification circuitry for providing amplification to an input signal and chopping circuitry for compensating for an input offset voltage of the amplifier by chopping the input signal. Additionally, the amplifier further includes a digitally-assisted feedback offset correction circuit, which includes a chopping ripple detection circuit, a feedback-path chopping circuit, a digital correction control circuit, and an offset correction circuit. The chopping ripple detection circuit generates a detected ripple signal based on detecting a chopping ripple of the amplifier. Additionally, the feedback-path chopping circuit demodulates the detected ripple signal using the amplifier's chopping clock signal. The digital correction control circuit receives the demodulated ripple signal, which the digital correction control circuit uses to control a value of a digital offset control signal that controls an amount of input offset correction provided by the offset correction circuit.

The digitally-assisted feedback offset correction circuit can be used to reduce or eliminate the amplifier's output ripple. For example, in the steady-state, the digitally-assisted feedback offset correction circuit can set the value of the digital offset control signal via feedback to operate the amplifier with relatively low input offset voltage and corresponding small output ripple.

In certain configurations, the digital correction control circuit can be controlled using a clock signal that has a relatively slow frequency during normal operation of the amplifier. In particular, the bandwidth of the digitally-assisted feedback offset correction circuit can be based on the rate at which the digital correction control circuit updates the value of the digital offset control signal. Thus, controlling the digital correction control circuit using a relatively slow clock signal can result in the digitally-assisted feedback offset correction circuit having narrow bandwidth, and thus a relatively small impact on the amplifier's gain versus frequency characteristics. Thus, in contrast to feedback and/or feedforward correction schemes that introduce anomalies such as notches in the amplifier's gain versus frequency characteristics, the teachings herein can be used to provide output ripple compensation with a relatively small amount of signal distortion. Furthermore, the amplifier's herein can operate without a need for a high-frequency signal compensation path used for compensating for such notches.

Thus, the feedback offset correction circuits herein can provide output ripple suppression with a very narrow bandwidth feedback loop, for instance, a loop bandwidth of less than 100 Hz. Thus, any notch in the amplifier's frequency response can be relatively small and/or undetectable, and the amplifier can operate with lower power consumption and/or reduced complexity. Additionally, the digitally-assisted feedback offset correction schemes herein can introduce a relatively small signal distortion and/or can operate without intermodulation.

In certain configurations, the chopping ripple detection circuit includes a transconductance ($G_M$) stage and one or more capacitors. The one or more capacitors can be used to AC couple a chopping ripple signal to the input of the transconductance stage, which can amplify the AC-coupled ripple signal to generate a detected ripple signal. The chopping ripple signal can correspond to a wide variety of signals indicative of the amplifier's output ripple, including, but not limited to, the amplifier's output signal, a feedback signal when the amplifier operates closed-loop, an output of an output chopping circuit, and/or an output of an amplification stage or buffer. The chopping ripple signal can be singled-ended or differential.

The detected ripple signal can be demodulated using the feedback-path chopping circuit to generate the demodulated ripple signal for the digital correction control circuit. In certain configurations, the digital correction control circuit can include one or more capacitors for integrating the demodulated ripple signal, a counter, and a comparator used to control the counter based on comparison operations of the integrated ripple signal. For example, the counter can use the output of the comparator to increment or decrement the value of the digital offset control signal in response to transitions of a control clock signal.

The offset correction circuit can be implemented in a variety of ways. In one example, the offset correction circuit includes a current-steering DAC that controls bias currents of a differential input transistor pair of the amplifier. For instance, a positive input offset voltage of the amplifier can be compensated for by increasing a bias current of a first transistor of the differential input transistor pair relative to a bias current of a second transistor of the differential input transistor pair. Similarly, a negative input offset voltage of the amplifier can be compensated for by increasing the bias current of the second transistor relative to the bias current of the first transistor. By controlling a difference in bias currents of the transistors of the differential input transistor pair, the current-steering DAC can compensate for a positive or a negative input offset voltage of the amplifier, thereby decreasing the amplifier's output ripple.

In certain configurations, the digital correction control circuit includes a counter controlled by a clock signal with a relatively slow frequency. Since the clock rate of the counter can control the bandwidth of the ripple reduction loop, using a counter controlled with a slow clock signal can provide narrow loop bandwidth and a corresponding small impact to the amplifier's frequency response to normal input signals. In certain implementations, the counter can provide adjustments to the value of the digital offset control signal based on a control clock signal having, for example, a frequency in the range of 0.1 Hz to 10 Hz. The control clock signal can have a frequency that is slow enough to have a relatively small impact on the amplifier's frequency characteristics, but fast enough to correct for slow temperature drifts of the amplifier's input offset voltage before chopping.

In certain configurations herein, an amplifier can be operable across two or more modes including a calibration mode and a normal operating mode. When operating in the calibration mode, the digital correction control circuit can be controlled using a fast clock signal. For example, the amplifier's frequency response to normal input signals may be relatively unimportant during the calibration mode, and thus the digital correction control circuit can be controlled with a clock signal of relatively high frequency to achieve fast settling time of the digitally-assisted feedback offset correction circuit. Additionally, when operating in the normal operating mode, the digital correction control circuit can be controlled using a slow clock signal that has a frequency that is less than that of the fast clock signal. Operating the digital correction control circuit using clock signals of different frequencies based on mode can aid in achieving both fast start-up time and excellent frequency characteristics during normal operation.

In certain configurations, the calibration mode is initiated after an amplifier is powered-on, and the amplifier's differential input voltage is controlled to about 0 V during calibration. For example, the amplifier's non-inverting input voltage terminal can be shorted to ground or another reference voltage and the amplifier's inverting input voltage terminal can be connected to the amplifier's output voltage terminal during the calibration mode. In certain configurations, the digitally-assisted feedback offset correction circuit includes circuitry such as a successive approximation register (SAR) that is activated during the calibration mode to further enhance loop lock time. For example, the SAR can be used to achieve a relatively fast convergence, for instance, convergence within N cycles, where N is a resolution of the digital offset control signal. The SAR can be deactivated during the normal operating mode.

Accordingly, implementing a digitally-assisted feedback offset correction circuit with multiple modes can aid in achieving faster settling time, while maintaining the benefits of narrow loop bandwidth during normal operation of the amplifier. In contrast, operating the digital correction control circuit with a slow clock signal during calibration may result in settling times of, for instance, 100 millisecond or more. In one embodiment, the control clock signal used to control the digital correction control circuit operates with a frequency that is at least a factor of 10 times greater in the calibration mode relative to the normal operating mode.

FIG. 1 is a schematic diagram illustrating one embodiment of a chopper amplifier 20 with digitally-assisted feedback offset correction. The chopper amplifier 20 includes a signal amplification circuit 1 and a digitally-assisted feedback offset correction circuit 2. The chopper amplifier 20 further includes a first or non-inverting input voltage terminal $V_{IN+}$, a second or inverting input voltage terminal $V_{IN-}$, and an output voltage terminal $V_{OUT}$.

The chopper amplifier 20 can receive a differential input voltage signal between the non-inverting and inverting input voltage terminals $V_{IN+}$, $V_{IN-}$, and can amplify the differential input voltage signal to generate an output voltage signal on the output voltage terminal $V_{OUT}$. Although FIG. 1 illustrates a configuration in which the chopper amplifier 20 generates a single-ended output voltage signal, the chopper amplifier 20 can be adapted to generate other output signals, including, for example, a differential output voltage signal and/or a single-ended or differential output current signal.

Additionally, although FIG. 1 illustrates the amplifier 20 in an open-loop configuration, the amplifier 20 can also be used closed-loop.

As shown in FIG. 1, the signal amplification circuit 1 includes an input chopping circuit 3, an output chopping circuit 4, amplification stages 5, and an output stage 6.

The amplification stages 5 can include amplification circuits or stages arranged to achieve a desired overall gain and performance of the chopper amplifier 20. For example, two or more amplification stages can be arranged in a cascade to increase overall gain. Although the illustrated chopper amplifier 20 includes a plurality of amplification stages 5, the teachings herein are also applicable to configurations using a single amplification stage.

The illustrated signal amplification circuit 1 also includes the output stage 6, which can be used to control the voltage of the output voltage terminal $V_{OUT}$. Including the output stage 6 can aid in obtaining a desired drive-strength, power efficiency, gain, and/or output impedance of the amplifier 20.

The input and output chopping circuits 3, 4 operate as chopping circuitry that provides chopping to the differential input voltage signal to compensate for the amplifier's input offset voltage. As skilled artisans will appreciate, input offset voltage can refer to a DC voltage between the non-inverting and inverting input voltage terminals $V_{IN+}$, $V_{IN-}$ that corresponds to an open-loop output voltage of about 0 V.

The input chopping circuit 3 can be used to modulate the differential input voltage signal using a chopping clock signal $CLK_{CHOP}$ that has chopping frequency $f_{CHOP}$. The chopped differential input signal can be provided as an input to the amplification stages 5, which can amplify the chopped differential input signal to generate an amplified differential signal. Additionally, the output chopping circuit 4 can be used to demodulate the amplified differential signal using the chopping clock signal $CLK_{CHOP}$.

For clarity of the figures, the input chopping circuit 3 and the output chopping circuit 4 are illustrated as providing chopping using the same clock signal. Although timing of input and output chopping operations can both be based on the chopping clock signal $CLK_{CHOP}$, the input chopping circuit 3 and the output chopping circuit 4 can operate using different clock signals or using different clock signal phases to enhance performance. For example, in one embodiment, a non-overlapping clock signal generator can be used to generate an input chopping clock signal for controlling the input chopping circuit 3 and an output chopping clock signal for controlling the output chopping circuit 4. Such details are omitted from FIG. 1 for clarity of the figures.

The input and output chopping circuits 3, 4 can be implemented in a wide variety of ways. In certain configurations, the input and/or output chopping circuits 3, 4 are implemented using switches that provide not only chopping, but additional functionality such as control over autozeroing operations of the amplifier. Although FIG. 1 illustrates the output chopping circuit 4 as being positioned after the amplification stages 5, in certain configurations, the output chopping circuit 4 can be positioned within or between the amplification stages 5. For example, the amplification stages 5 can include a first stage and a second stage, and the output chopping circuit 3 can be positioned between the output of the first stage and the input to the second stage.

The chopper amplifier 20 can have an output ripple that has a magnitude that changes in relation to a magnitude of the amplifier's input offset voltage before chopping. For example, the output chopping circuit 4 can be used to chop the output of the amplification stages 5, and thus the output of the output chopping circuit 4 can have a magnitude near the chopping frequency $f_{CHOP}$ that is about proportional to the input offset voltage of the amplification stages 5. For example, when the amplifier's differential input voltage signal is about 0 V and the digitally-assisted feedback offset correction circuit 2 is omitted, the output chopping circuit's output can be a square wave signal with an amplitude proportional to the amplifier's input offset voltage and a frequency about equal to the chopping frequency $f_{CHOP}$. Such a square wave signal can be equivalently represented by a Fourier series of sine waves at the chopping frequency $f_{CHOP}$ and at odd harmonics thereof, and can be manifested as output ripple.

The digitally-assisted feedback offset correction circuit 2 receives a chopping ripple signal 17 and generates an offset correction signal 18. The digitally-assisted feedback offset correction circuit 2 includes a chopping ripple detection circuit 11, a feedback-path chopping circuit 12, a digital correction control circuit 13, and an offset correction circuit 14. The digitally-assisted feedback offset correction circuit 2 can be used to sense the amplifier's output ripple and to generate the offset correction signal 18 to compensate for the amplifier's input offset voltage, thereby suppressing the output ripple.

For example, the chopping ripple detection circuit 11 can be used to detect an amount of ripple in the chopping ripple signal 17, and to generate a detected ripple signal based on the result. Additionally, the feedback-path chopping circuit 12 can be used to demodulate the detected ripple signal using the chopping clock signal $CLK_{CHOP}$ to generate a demodulated ripple signal. Thus, the demodulated ripple signal can have a DC or baseband frequency content indicative of the amplitude of the amplifier's output ripple. Although FIG. 1 illustrates the feedback-path chopping circuit 12 as operating using the same chopping clock signal $CLK_{CHOP}$ as the input chopping circuit 3 and the output chopping circuit 4, the input chopping circuit 3, the output chopping circuit 4, and/or the feedback-path chopping circuit 12 can operate using different clock signals or different clock signal phases to enhance performance.

The digital correction control circuit 13 receives the demodulated ripple signal and a control clock signal $CLK_{CTL}$, and generates a digital offset control signal CTL. The digital correction control circuit 13 can change or update a value of the digital offset control signal CTL based on a frequency of the control clock signal $CLK_{CTL}$. In certain configurations, the control clock signal $CLK_{CTL}$ can operate with a relatively slow frequency, such as a frequency of less than 100 Hz.

By configuring the control clock signal $CLK_{CTL}$ to have a slow frequency, the loop bandwidth of the digitally-assisted feedback offset correction circuit can be very narrow. Thus, the digitally-assisted feedback offset correction circuit 2 can have a relatively small impact on the gain versus frequency response of the amplifier 20 to normal input signals. For example, operating the digitally-assisted feedback offset correction circuit 2 with narrow bandwidth can avoid the generation of notches in a gain versus frequency response of the amplifier 20.

The offset correction circuit 14 can be used to correct for an input offset of the signal amplification circuit 1 based on the value of the digital offset control signal CTL. The offset correction circuit 14 can be implemented in a variety of ways.

In one example, the offset correction circuit 14 corrects for input offset voltage by adjusting a relative amplification strength of transistors in a differential input transistor pair of the amplification stages 5. For example, the offset correction circuit 14 can be used to control a bias current of a first transistor relative to a bias current of a second transistor of the differential input transistor pair based on the value of the digital offset control signal CTL. In another example, an auxiliary amplification stage operates in parallel with an input amplification stage of the amplification stages 5, and the value of the digital offset control signal CTL controls a differential input voltage to the auxiliary amplification stage. Although two examples of input offset correction using a digital offset control signal have been described, the teachings herein are applicable to a wide range of input offset correction schemes.

Accordingly, the digitally-assisted feedback offset correction circuit 2 operates to compensate for the amplifier's input offset voltage, thereby reducing or eliminating the amplifier's output ripple. The digitally-assisted feedback offset correction circuit 2 is implemented to operate with narrow bandwidth, which enhances performance. Thus, the chopper amplifier 20 can operate with a small amount of signal distortion. The chopper amplifier 20 can also operate with lower complexity and/or power relative to configurations in which an additional high-frequency signal amplification path is provided to compensate for a notch in frequency response caused by a feedback or feedforward ripple suppression loop.

In certain configurations, the digitally-assisted feedback offset correction circuit 2 is operable between two or more modes including a calibration mode and a normal operating mode.

Additionally, during the calibration mode, the voltage between the non-inverting and inverting input voltage terminals $V_{IN+}$, $V_{IN-}$ is controlled to about 0 V, and the control clock signal $CLK_{CTL}$ is operated with a relative fast frequency. Configuring the digitally-assisted feedback offset correction circuit 2 in this manner can speed up the settling time of the digitally-assisted feedback offset correction circuit 2. In particular, the value of the digital offset control signal CTL can reach a steady-state value relatively quickly by operating the digital correction control circuit 13 with a relatively fast clock signal.

Furthermore, during the normal operating mode, the chopper amplifier 20 can provide signal amplification to a differential input signal while the digitally-assisted feedback offset correction circuit 2 can provide background offset correction and output ripple compensation. During the normal operating mode, the control clock signal $CLK_{CTL}$ can be operated with a relative slow frequency, such that the digitally-assisted feedback offset correction circuit has a relatively small impact on the gain versus frequency response of the amplifier 20. However, the digitally-assisted feedback offset correction circuit 2 can nevertheless adapt to slow temperature drift of the amplifier's input offset voltage or other dynamic changes to the amplifier's input offset voltage.

Configuring the frequency of the control clock signal $CLK_{CTL}$ to change based on mode can help achieve both fast start-up time and good gain versus frequency characteristics.

FIGS. 2A-2F show schematic diagrams of chopper amplifiers with digitally-assisted feedback offset correction in accordance with various embodiments. For clarity of the figures, clock signals are not illustrated in FIGS. 2A-2F.

The embodiments illustrated in FIGS. 2A-2F depict various non-limiting configurations of signal amplification circuitry coupled to a digitally-assisted feedback offset correction circuit. Although six embodiments have been shown, signal amplification circuitry can be implemented in a wide variety of ways and the digitally-assisted feedback offset correction circuit can be coupled to signal amplification circuitry using other arrangements.

Figure 2A:
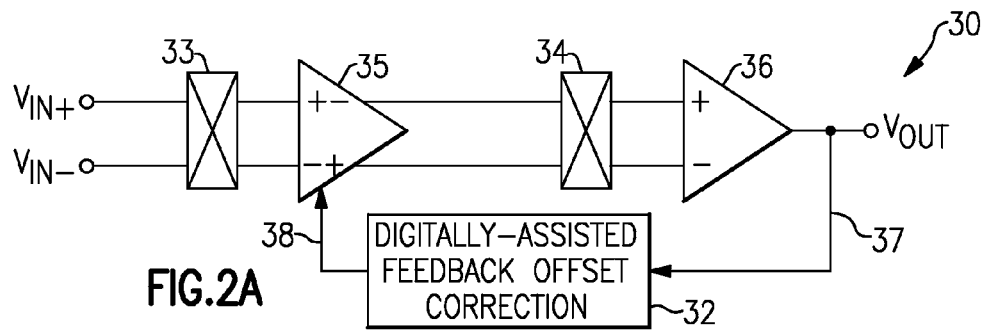
FIGS. 2A-2F show schematic diagrams of chopper amplifiers with digitally-assisted feedback offset correction in accordance with various embodiments.

FIG. 2A is a schematic diagram illustrating another embodiment of a chopper amplifier 30 with digitally-assisted feedback offset correction. The chopper amplifier 30 includes a digitally-assisted feedback offset correction circuit 32, an input chopping circuit 33, an output chopping circuit 34, a first or input amplification stage 35, and an output stage 36. The chopper amplifier 30 further includes a non-inverting input voltage terminal $V_{IN+}$, an inverting input voltage terminal $V_{IN-}$, and an output voltage terminal $V_{OUT}$.

As shown in FIG. 2A, the input chopping circuit 35 includes a differential input electrically connected to the input voltage terminals $V_{IN+}$, $V_{IN-}$ and a differential output coupled to a differential input of the input amplification stage 35. The input amplification stage 35 further includes a control input that receives an input offset correction signal 38 from the digitally-assisted feedback offset correction circuit 32 and a differential output electrically connected to a differential input of the output chopping circuit 34. The output chopping circuit 34 further includes a differential output electrically connected to a differential input of the output stage 36. The output stage 36 further includes a single-ended output electrically coupled to the output voltage terminal $V_{OUT}$ and that provides a chopping ripple signal 37 to the digitally-assisted feedback offset correction circuit 32.

In the configuration shown in FIG. 2A, the chopping ripple signal 37 corresponds to the voltage of the output voltage terminal $V_{OUT}$.

Figure 2B:
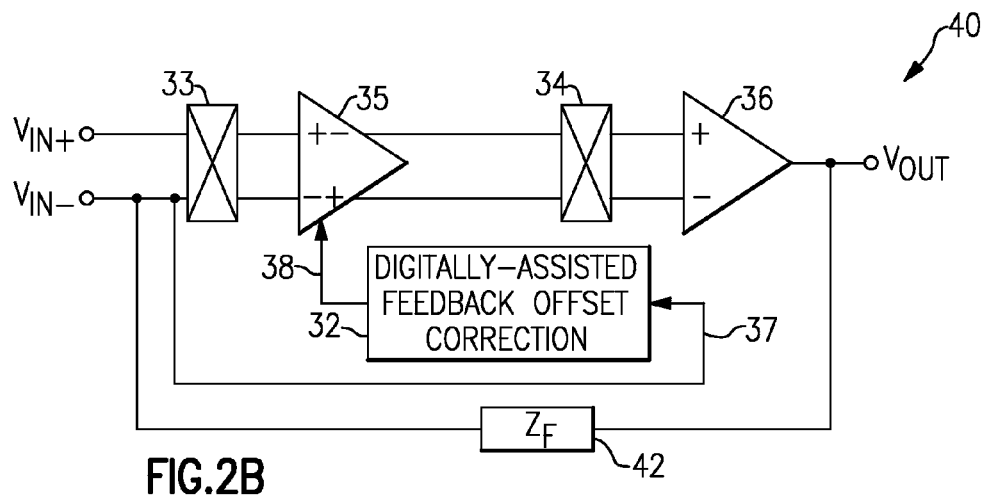

FIG. 2B is a schematic diagram illustrating one embodiment of a chopper amplifier 40 connected with negative feedback. The chopper amplifier 40 includes the inverting input voltage terminal $V_{IN-}$, the non-inverting input voltage terminal $V_{IN+}$, the output voltage terminal $V_{OUT}$, the digitally-assisted feedback offset correction circuit 32, the input chopping circuit 33, the output chopping circuit 34, the input amplification stage 35, and the output stage 36, which can be similar to those described earlier.

As shown in FIG. 2B, the chopper amplifier 40 further includes a feedback circuit 42 ($Z_F$) that is electrically connected between the output voltage terminal $V_{OUT}$ and the inverting input voltage terminal $V_{IN-}$. In the illustrated embodiment, the chopping ripple signal 37 corresponds to the voltage of the inverting input voltage terminal $V_{IN-}$.

Since the chopper amplifier 40 is connected with negative feedback, the voltage of the amplifier's inverting input voltage terminal $V_{IN-}$ can change in relation to the voltage of the amplifier's output voltage terminal $V_{OUT}$. Accordingly, the voltage of the amplifier's inverting input voltage terminal $V_{IN-}$ can include an output ripple of the amplifier, and can be suitable for use as an input to the digitally-assisted feedback offset correction circuit 32.

Additional details of the chopper amplifier 40 of FIG. 2B can be similar to those described earlier.

Figure 2C:
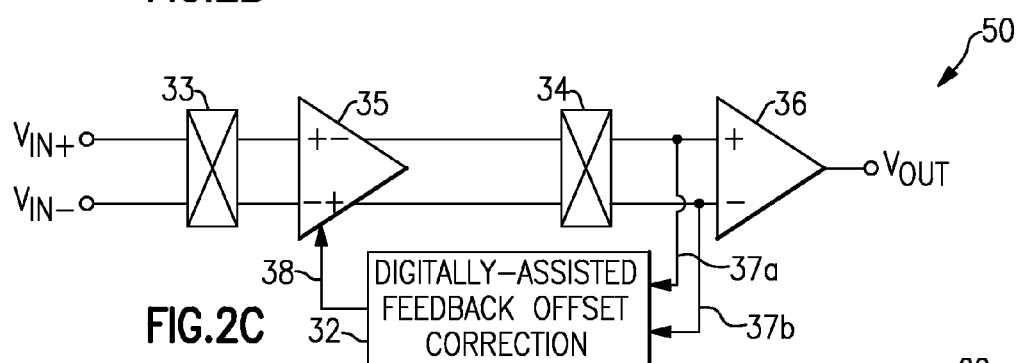

FIG. 2C is a schematic diagram illustrating another embodiment of a chopper amplifier 50 with digitally-assisted feedback offset correction. The chopper amplifier 50 includes the inverting input voltage terminal $V_{IN-}$, the non-inverting input voltage terminal $V_{IN+}$, the output voltage terminal $V_{OUT}$, the digitally-assisted feedback offset correction circuit 32, the input chopping circuit 33, the output chopping circuit 34, the input amplification stage 35, and the output stage 36, which can be similar to those described earlier.

The chopper amplifier 50 of FIG. 2C is similar to the chopper amplifier 30 of FIG. 2A, except that the chopper amplifier 50 of FIG. 2C illustrates a configuration in which the differential output of the output chopping circuit 34 is provided as an input to the digitally-assisted feedback offset correction circuit 32. Thus, the chopping ripple signal 37a, 37b is differential in this configuration, and includes a non-inverted signal component 37a and an inverted signal component 37b.

Additional details of the chopper amplifier 50 of FIG. 2C can be similar to those described earlier.

Figure 2D:
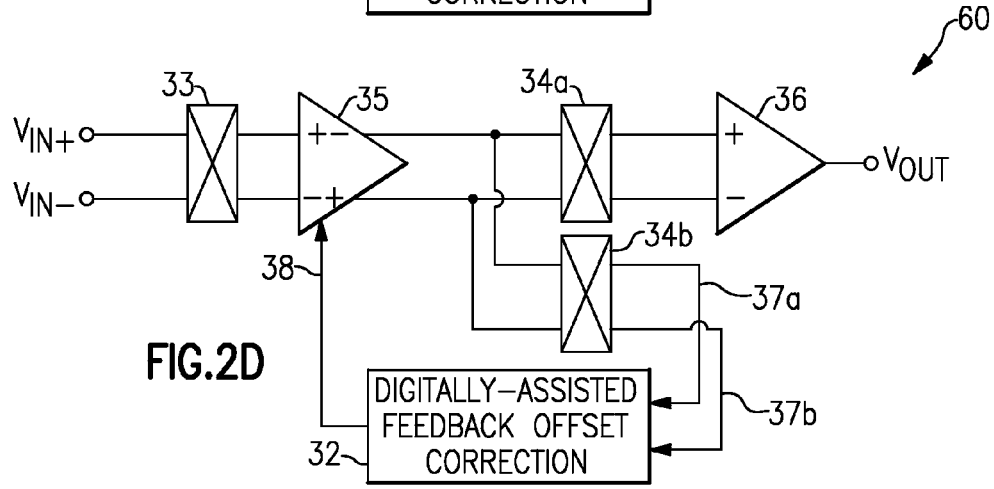

FIG. 2D is a schematic diagram illustrating another embodiment of a chopper amplifier 60 with digitally-assisted feedback offset correction. The chopper amplifier 60 includes the inverting input voltage terminal $V_{IN-}$, the non-inverting input voltage terminal $V_{IN+}$, the output voltage terminal $V_{OUT}$, the digitally-assisted feedback offset correction circuit 32, the input chopping circuit 33, the input amplification stage 35, and the output stage 36, which can be similar to those described earlier. The chopper amplifier 60 further includes a first output chopping circuit 34a and a second output chopping circuit 34b.

The chopper amplifier 60 of FIG. 2D is similar to the chopper amplifier 50 of FIG. 2C, except that the chopper amplifier 60 includes a different implementation of output chopping circuitry. For example, the chopper amplifier 60 includes the first output chopping circuit 34a, which includes a differential input electrically connected to the differential output of the input amplification stage 35 and a differential output electrically connected to a differential input of the output stage 36. Additionally, the chopper amplifier 60 includes the second output chopping circuit 34b, which includes a differential input electrically connected to the differential output of the input amplification stage 35 and a differential output that generates the chopping ripple signal 37a, 37b for the digitally-assisted feedback offset correction circuit 32.

Including the second output chopping circuit 34b for generating the chopping ripple signal 37a, 37b can enhance performance by reducing an output loading of the first output chopping circuit 34a, which operates in the amplifier's signal path.

Additional details of the chopper amplifier 60 can be similar to those described earlier.

Figure 2E:
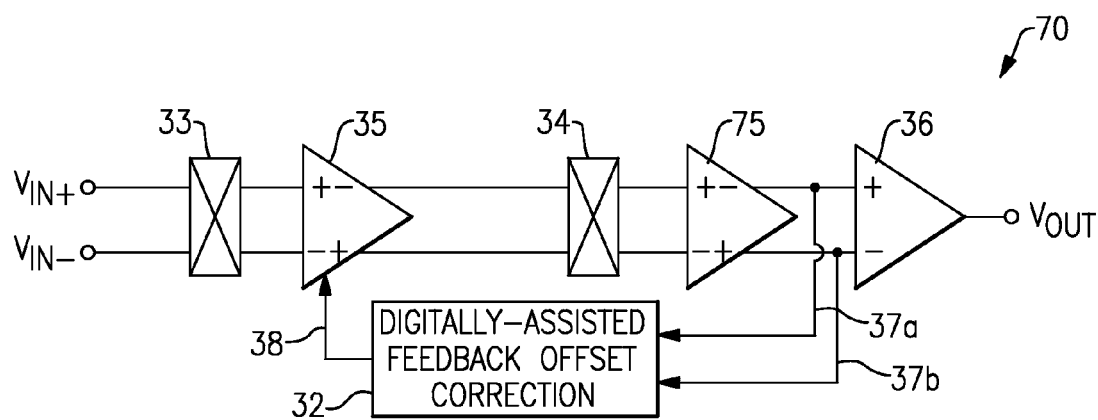

FIG. 2E is a schematic diagram illustrating another embodiment of a chopper amplifier 70 with digitally-assisted feedback offset correction. The chopper amplifier 70 includes the inverting input voltage terminal $V_{IN-}$, the non-inverting input voltage terminal $V_{IN+}$, the output voltage terminal $V_{OUT}$, the digitally-assisted feedback offset correction circuit 32, the input chopping circuit 33, the output chopping circuit 34, the first amplification stage 35, and the output stage 36, which can be similar to those described earlier. The chopper amplifier 70 further includes a second amplification stage 75.

The chopper amplifier 70 of FIG. 2E is similar to the chopper amplifier 50 of FIG. 2C, except that the chopper amplifier 70 of FIG. 2E further includes the second amplification stage 75. The second amplification stage 75 includes a differential input electrically connected to the differential output of the output chopping circuit 34 and a differential output electrically connected to a differential input of the output stage 36. The differential output of the second amplification stage 75 also serves to generate the chopping ripple signal 37a, 37b that is provided to the digitally-assisted feedback offset correction circuit 32.

Including the second amplification stage 75 can aid in increasing the overall gain of the chopper amplifier 70.

Additional details of the chopper amplifier 70 can be similar to those described earlier.

Figure 2F:
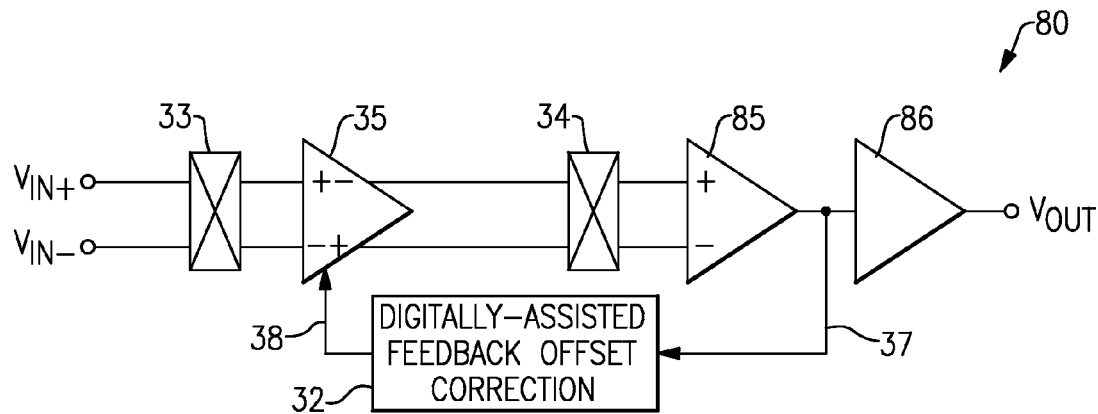

FIG. 2F is a schematic diagram illustrating another embodiment of a chopper amplifier 80 with digitally-assisted feedback offset correction. The chopper amplifier 80 includes the inverting input voltage terminal $V_{IN-}$, the non-inverting input voltage terminal $V_{IN+}$, the output voltage terminal $V_{OUT}$, the digitally-assisted feedback offset correction circuit 32, the input chopping circuit 33, the output chopping circuit 34, and the first amplification stage 35, which can be similar to those described earlier. The chopper amplifier 80 further includes a second amplification stage 85 and an output stage 86.

The chopper amplifier 80 of FIG. 2F is similar to the chopper amplifier 70 of FIG. 2E, except that the chopper amplifier 80 illustrates a configuration in which the second amplification stage 85 includes a single-ended output and in which the output stage 86 includes a single-ended input. For example, the second amplification stage 85 of FIG. 2F includes a differential input electrically connected to the differential output of the output chopping circuit 34 and a single-ended output electrically connected to a single-ended input of the output stage 86. The single-ended output of the second amplification stage 85 is also configured to generate the chopping ripple signal 37.

Additional details of the chopper amplifier 80 can be similar to those described earlier.

Figure 3:
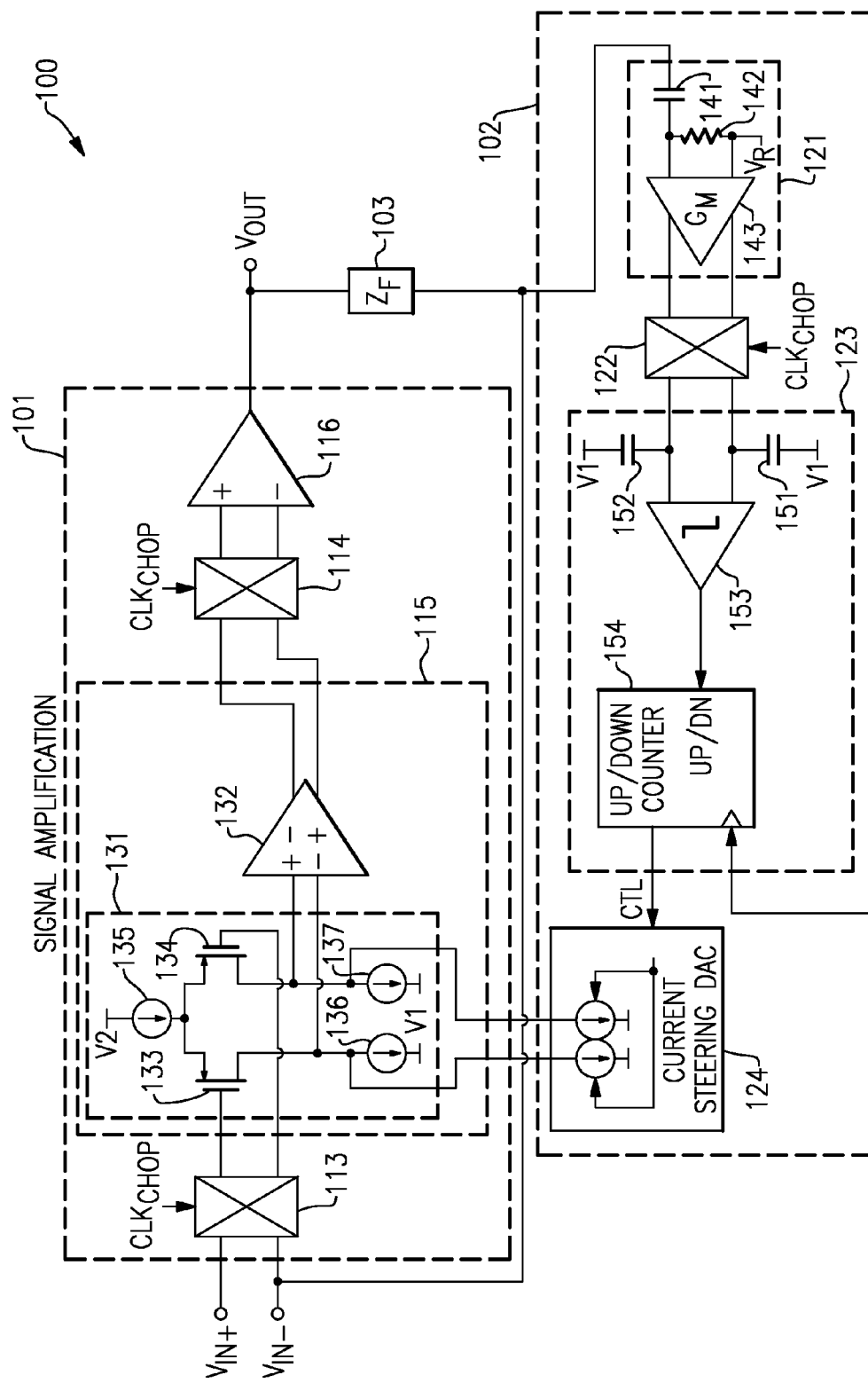
FIG. 3 is a schematic diagram illustrating another embodiment of a chopper amplifier with digitally-assisted feedback offset correction.

FIG. 3 is a schematic diagram illustrating another embodiment of a chopper amplifier 100 with digitally-assisted feedback offset correction. The chopper amplifier 100 includes a non-inverting input voltage terminal $V_{IN+}$, an inverting input voltage terminal $V_{IN-}$, an output voltage terminal $V_{OUT}$, a signal amplification circuit 101, a digitally-assisted feedback offset correction circuit 102, and feedback circuit 103 ($Z_F$).

The signal amplification circuit 101 includes an input chopping circuit 113, an output chopping circuit 114, amplification stages 115, and an output stage 116. The amplification stages 115 include a first amplification stage 131 and a second amplification stage 132.

As shown in FIG. 3, the input chopping circuit 113 includes a differential input electrically connected to the input terminals $V_{IN+}$, $V_{IN-}$ and a differential output electrically connected to a differential input of the first amplification stage 131. A chopping operation of the input chopping circuit 113 is controlled based on a chopping clock signal $CLK_{CHOP}$. The first amplification stage 131 further includes a differential output electrically connected to a differential input of the second amplification stage 132. The second amplification stage 132 further includes a differential output electrically connected to a differential input of the output chopping circuit 114. The output chopping circuit 114 further includes a differential output electrically connected to a differential input of the output stage 116, and a chopping operation of the output chopping circuit 114 is controlled based on the chopping clock signal $CLK_{CHOP}$. The output stage 116 further includes an output electrically connected to the output voltage terminal $V_{OUT}$. The feedback circuit 103 is electrically connected between the output voltage terminal $V_{OUT}$ and the inverting input voltage terminal $V_{IN-}$.

As shown in FIG. 3, the first amplification stage 131 includes a differential input transistor pair including a first field effect transistor (FET) 133 and a second FET 134. The first amplification stage 131 further includes a tail current source 135 that generates a tail current of the differential input transistor pair, a first current source 136 that generates a bias current of the first FET 133, and a second current source 137 that generates a bias current of the second FET 134. In the illustrated configuration, the first and second FETs 133, 134 are implemented as p-type metal oxide (MOS) semiconductor transistors. However, other configurations are possible, including, for example, implementations in which the differential input transistor pair uses n-type MOS transistors. As shown in FIG. 3, electrical connections to a first or power supply low voltage V1 (for example, ground) and a second or power high supply voltage V2 have been illustrated.

The amplifier's input offset voltage can correspond to an input offset voltage of the differential input transistor pair. Even when the first and second FETs 133, 134 have identical sizes and circuit layouts, the differential input transistor pair can nevertheless have an input offset voltage associated with manufacturing variation. As will be described in detail further below, the bias currents of the first and second FETs 133, 134 can be adjusted by the digitally-assisted feedback offset correction circuit 102 to correct the amplifier's input offset voltage. Since the amplifier's chopping operations can result in an input offset voltage manifesting itself as output ripple, compensating for the amplifier's input offset voltage can also compensate for output ripple.

The digitally-assisted feedback offset correction circuit 102 includes a chopping ripple detection circuit 121, a feedback-path chopping circuit 122, a digital correction control circuit 123, and a current steering digital-to-analog converter (DAC) 124 that operates as an offset correction circuit.

As shown in FIG. 3, the chopping ripple detection circuit 121 includes an input electrically connected to the inverting input voltage terminal $V_{IN-}$ and a differential output electrically connected to a differential input of the feedback-path chopping circuit 122. The feedback-path chopping circuit 122 further includes a differential output electrically connected to a differential input of the digital correction control circuit 123, and a chopping operation of the feedback-path chopping circuit 122 is controlled based on the chopping clock signal $CLK_{CHOP}$.

The illustrated chopping ripple detection circuit 121 includes an AC-coupling capacitor 141, a resistor 142, and a transconductance ($G_M$) circuit or stage 143. Output ripples of the amplifier 100 can reach the input of the transconductance stage 143 via the feedback circuit 103 and the AC-coupling capacitor 141. Thus, a differential input voltage to the transconductance stage 143 can change in relation to the amplifier's output ripple, which the transconductance stage 143 amplifies to generate a detected ripple signal. Additionally, the feedback-path chopping circuit 122 demodulates the detected ripple signal to generate a demodulated ripple signal.

In the illustrated configuration, the resistor 142 is electrically connected between a first input and a second input of the transconductance stage 143. Additionally, the first input of the transconductor stage 143 is electrically connected to the AC-coupling capacitor 141, and the second input of the transconductance stage 143 is electrically connected to the reference voltage $V_R$. The reference voltage $V_R$ can be any suitable reference voltage level, including, but not limited to, ground.

The illustrated digital correction control circuit 123 includes a first integration capacitor 151, a second integration capacitor 152, a comparator 153, and a counter 154. The first and second integration capacitors 151, 152 are used to integrate the demodulated ripple signal, and the comparator 153 controls the counter 154 based on comparing the voltage across the first integration capacitor 151 to the voltage across the second integration capacitor 152. As shown in FIG. 3, the counter 154 includes a counter input (UP/DN) that receives the output of the comparator 153, a clock input that receives a slow clock signal $CLK_{SLOW}$, and a counter output that generates a digital offset control signal CTL.

In one embodiment, at least one of the transconductance stage 143 or the comparator 153 is regularly auto-zeroed to compensate for the impacts of offset on the operation of the digitally-assisted feedback offset correction circuit 102. For example, the transconductance stage 143 and/or the comparator 153 can be auto-zeroed on a rising edge of the slow clock signal $CLK_{SLOW}$ and the comparator 153 can be latched on a falling edge of the slow clock signal $CLK_{SLOW}$ or vice versa. In one embodiment, a duty cycle of the slow clock signal $CLK_{SLOW}$ is asymmetric such the duration that the transconductance stage 143 and/or the comparator 153 are auto-zeroed is much shorter (for example, at least a factor of 10 to 100 shorter) than the duration that the transconductance stage 143 and/or the comparator 153 are not being auto-zeroed. Configuring the duty-cycle in this manner can prevent auto-zero loop droop from impacting operation of the digitally-assisted feedback offset correction circuit 102.

The current steering DAC 124 receives the digital offset control signal CTL, and uses the digital offset control signal CTL to adjust the first and second bias currents of the first amplification stage 131. Accordingly, the current steering DAC 124 can be used to adjust an input offset voltage of the first amplification stage 131 by adjusting the first and second bias currents of the first and second FETs 133, 134, respectively. By adjusting the bias current of the first FET 133 relative to the bias current of the second FET 134, the input offset voltage of the chopper amplifier 100 can be controlled.

In certain configurations, the clock rate of the slow clock signal $CLK_{SLOW}$ is selected to be relatively slow, for example, a frequency in the range of 0.1 Hz to 10 Hz. Since the clock rate of the counter 154 can control the bandwidth of the digitally-assisted feedback offset correction circuit 102, using a slow clock signal can provide narrow loop bandwidth and a corresponding small impact to the amplifier's frequency response to normal input signals. Accordingly, the slow clock signal $CLK_{SLOW}$ can have a frequency that is slow enough to have a relatively small impact on the amplifier's frequency characteristics, but fast enough to correct for slow temperature drifts of the amplifier's input offset voltage before chopping.

Additional details of the chopper amplifier 100 can be similar to those described earlier.

Figure 4:
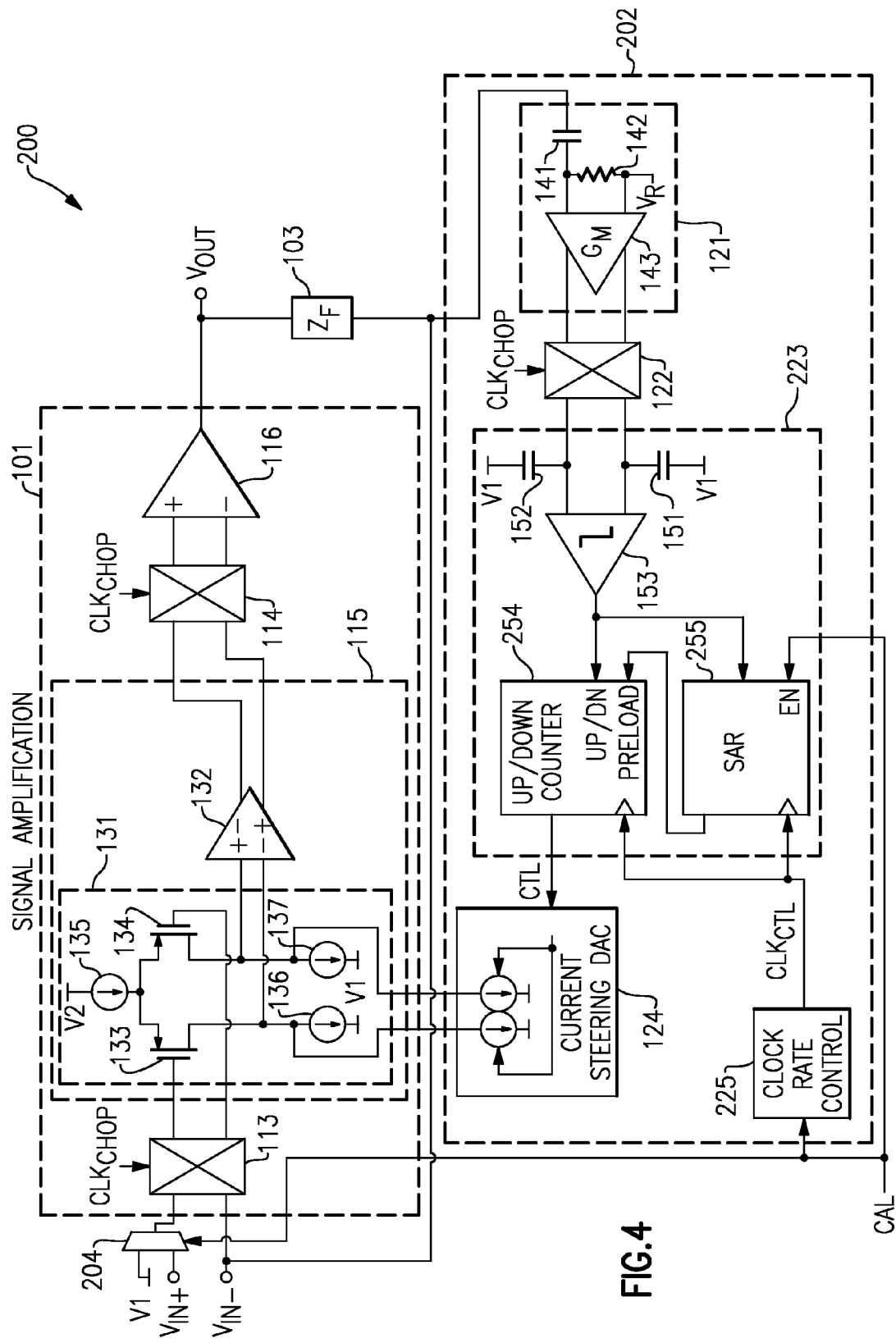
FIG. 4 is a schematic diagram illustrating another embodiment of a chopper amplifier with digitally-assisted feedback offset correction.

FIG. 4 is a schematic diagram illustrating another embodiment of a chopper amplifier 200 with digitally-assisted feedback offset correction. The chopper amplifier 200 includes the non-inverting input voltage terminal $V_{IN+}$, the inverting input voltage terminal $V_{IN-}$, the output voltage terminal $V_{OUT}$, the signal amplification circuit 101, and the feedback circuit 103, which can be as described earlier. The chopper amplifier 200 further includes a digitally-assisted feedback offset correction circuit 202 and a multiplexer 204.

The chopper amplifier 200 of FIG. 4 is similar to the chopper amplifier 100 of FIG. 3, except that the chopper amplifier 200 has been implemented to operate across multiple modes including a calibration mode and a normal operating mode. For example, the chopper amplifier 200 receives a calibration signal CAL that controls whether the chopper amplifier 200 operates in the calibration mode or in the normal operating mode.

As shown in FIG. 4, the multiplexer 204 receives the calibration signal CAL. When operating in the normal operating mode, the multiplexer 204 electrically connects the non-inverting input voltage terminal $V_{IN+}$ to a non-inverting input of the signal amplification circuit 101, such that the signal amplification circuit 101 provides amplification to the differential input voltage signal received between the non-inverting and inverting input voltage terminals $V_{IN+}$, $V_{IN-}$. However, when operating in the calibration mode, the multiplexer 204 electrically connects the power low supply voltage V1 to the signal amplification circuit's non-inverting input. Since the amplifier's output voltage terminal $V_{OUT}$ is electrically connected to the amplifier's inverting input voltage terminal $V_{IN-}$ via the feedback circuit 103, negative feedback can result in the differential input voltage to the signal amplification circuit 101 being about 0 V in the calibration mode. Thus, the multiplexer 204 operates to provide the differential input voltage signal to the signal amplification circuit 101 in the normal operating mode and to provide a differential input voltage of about 0 V to the signal amplification circuit 101 in the calibration mode.

The digitally-assisted feedback offset correction circuit 202 of FIG. 4 includes the chopping ripple detection circuit 121, the feedback-path chopping circuit 122, and the current steering DAC 124, which can be as described earlier. The digitally-assisted feedback offset correction circuit 202 further includes a digital correction control circuit 223 and a clock rate control circuit 225.

As shown in FIG. 4, the clock rate control circuit 225 generates a control clock signal $CLK_{CTL}$, which is used to control a rate that the digital correction control circuit 223 updates the digital offset control signal CTL and a corresponding loop bandwidth of the digitally-assisted feedback offset correction circuit 202. The clock rate control circuit 225 receives the calibration signal CAL, and controls the frequency of the control clock signal $CLK_{CTL}$ based on the mode of operation indicated by the calibration signal CAL. In particular, the clock rate control circuit 225 operates the control clock signal $CLK_{CTL}$ with a relatively fast frequency in the calibration mode and with a relatively slow frequency in the normal operating mode. Operating the digital correction control circuit 223 using a fast clock signal in the calibration mode and a slow clock signal in the normal operating mode advantageously achieves both fast initial loop settling time and excellent frequency characteristics during normal operation.

In one embodiment, the clock rate control circuit 225 controls the control clock signal $CLK_{CTL}$ to operate with a frequency that is at least a factor of 10 times greater in the calibration mode relative to the normal operating mode.

The illustrated digital correction control circuit 223 includes the first and second integration capacitors 151, 152 and the comparator 153, which can be as described earlier. The illustrated digital correction control circuit 223 further includes a counter 254 and a successive approximation register (SAR) 255. As shown in FIG. 4, the counter 254 includes a counter input (UP/DN) that receives the output of the comparator 153, a clock input that receives the control clock signal $CLK_{CTL}$, a counter output that generates the digital offset control signal CTL, and a preload input. The SAR 255 includes a register input that receives the output of the comparator 153, an enable input that receives the calibration signal CAL, a clock input that receives the control clock signal $CLK_{CTL}$, and a register output that controls the preload input of the counter 254.

When the digital correction control circuit 223 is in the normal operating mode, the counter 254 controls the value of the digital offset control signal CTL based on the output of the comparator 153 in a manner similar to that described earlier with respect to FIG. 3. However, when the digital correction control circuit 223 is in the calibration mode, the SAR 255 controls the counter 254 via the preload input to reduce a settling-time of the digitally-assisted feedback offset correction circuit 202. As skilled artisans wills appreciate, the SAR 255 controls the counter 254 via a successive approximate algorithm.

Accordingly, the SAR 255 is activated during the calibration mode to further enhance loop lock time. Including a SAR in a digital correction control circuit can aid in achieving a relatively fast settling of a value of the digital offset control signal CTL during start-up. For instance, the value of the digital offset control signal CTL can converge within N cycles, where N is the number of bits of the digital offset control signal CTL. The SAR 255 can be deactivated during the normal operating mode.

Additional details of the chopper amplifier 200 can be similar to those described earlier.

Figure 5:
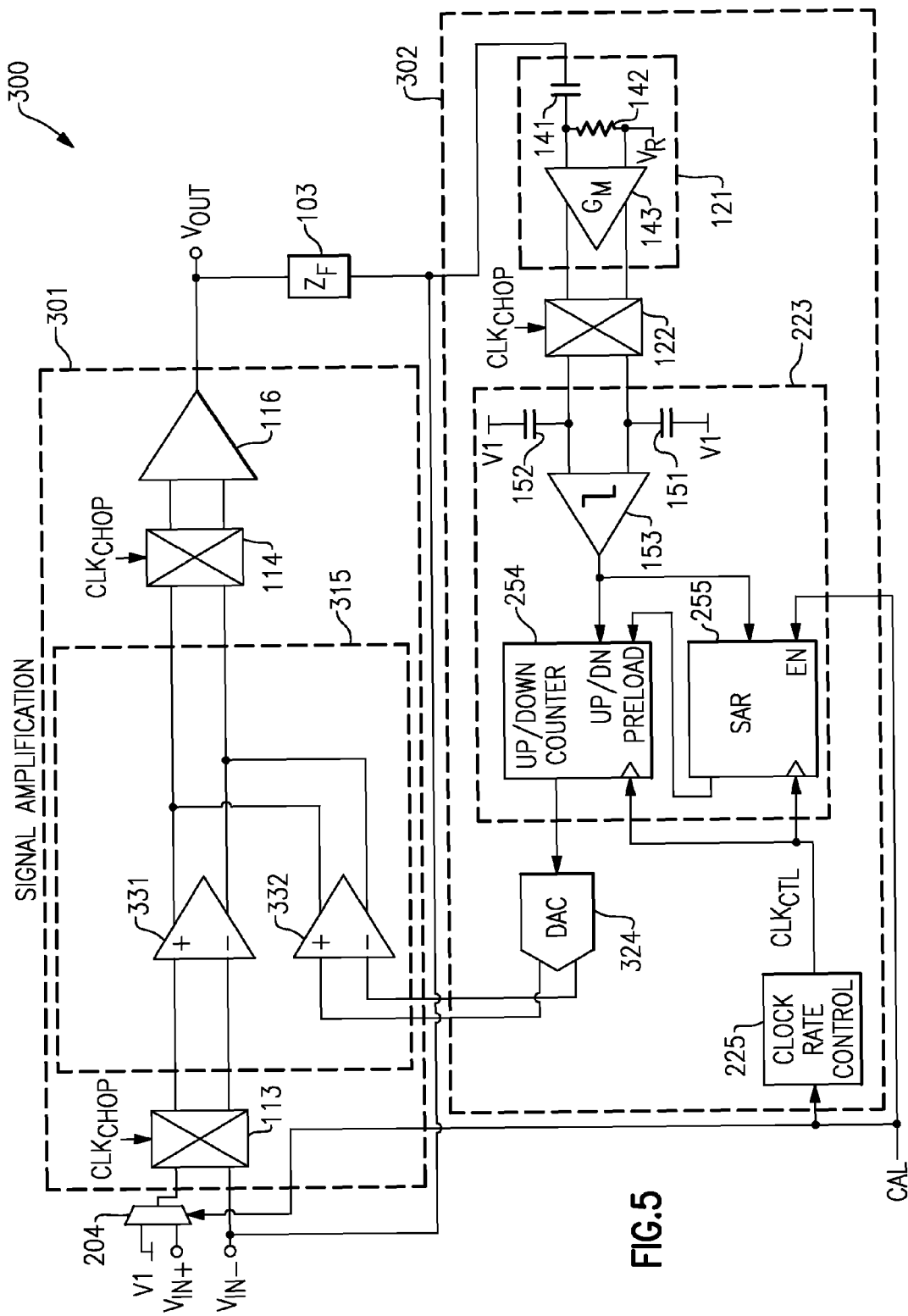
FIG. 5 is a schematic diagram illustrating another embodiment of a chopper amplifier with digitally-assisted feedback offset correction.

FIG. 5 is a schematic diagram illustrating another embodiment of a chopper amplifier 300 with digitally-assisted feedback offset correction. The chopper amplifier 300 includes the non-inverting input voltage terminal $V_{IN+}$, the inverting input voltage terminal $V_{IN-}$, the output voltage terminal $V_{OUT}$, the feedback circuit 103, and the multiplexer 204, which can be as described earlier. The chopper amplifier 300 further includes a signal amplification circuit 301 and a digitally-assisted feedback offset correction circuit 302.

The signal amplification circuit 301 of FIG. 5 is similar to the signal amplification circuit 101 of FIG. 4, except that the signal amplification circuit 301 includes a different configuration of amplification stages 315. Additionally, the digitally-assisted feedback offset correction circuit 302 of FIG. 5 is similar to the digitally-assisted feedback offset correction circuit 202 of FIG. 4, except that the digitally-assisted feedback offset correction circuit 302 includes a voltage digital-to-analog converter (DAC) 324 rather that the current-steering DAC 124.

The chopper amplifier 300 of FIG. 5 includes a different implementation of input offset compensation relative to the chopper amplifier 200 of FIG. 4. For example, the amplification stages 315 include an input amplification stage 331 and an auxiliary amplification stage 332 that operate in parallel with one another. Additionally, the voltage DAC 324 controls a differential input voltage to the auxiliary amplification stage 332. Thus, the value of the digital offset control signal CTL controls the amount of input offset voltage correction provided by the digitally-assisted feedback offset correction circuit 302 by controlling the auxiliary amplification stage's differential input voltage.

Although two examples of input offset correction have been shown in FIGS. 4 and 5, the teachings herein are applicable to a wide range of input offset voltage correction schemes.

Additional details of the chopper amplifier 300 can be similar to those described earlier.

Figure 6:
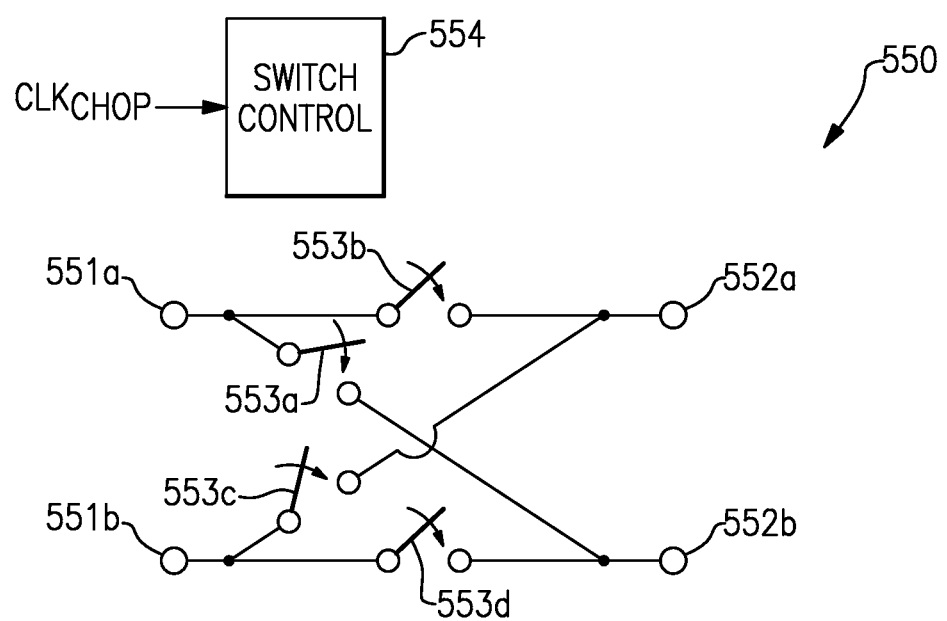
FIG. 6 is a schematic diagram of one example of a chopping circuit.

FIG. 6 is a schematic diagram of one example of a chopping circuit 550. The chopping circuit 550 includes first and second inputs 551a, 551b that operate as a differential input, first and second outputs 552a, 552b that operate as a differential output, first to fourth switches 553a-553d, and a switch control circuit 554. As shown in FIG. 6, the switch control circuit 554 receives a chopping clock signal $CLK_{CHOP}$, which can be used to control a state of the switches 553a-553d over time. Although illustrated as including the switch control circuit 554, in certain configurations the switch control circuit 554 is omitted in favor of providing multiple clock signals (for example, inverted and non-inverted versions of a chopping clock signal) to the chopping circuit 550.

The first input 551a is electrically connected to a first end of the first switch 553a and to a first end of the second switch 553b. The second input 551b is electrically connected to a first end of the third switch 553c and to a first end of the fourth switch 553d. The first output 552a is electrically connected to a second end of the second switch 553b and to a second end of the third switch 553c. The second output 552b is electrically connected to a second end of the first switch 553a and to a second end of the fourth switch 553d.

The chopping circuit 550 can be used to chop a differential input signal received between the first and second inputs 551a, 551b to generate a differential chopped signal between the first and second outputs 552a, 552b. For example, during a first clock phase of the chopping clock signal $CLK_{CHOP}$, the switch control circuit 554 can close the second and fourth switches 553b, 553d and open the first and third switches 553a, 553c. Additionally, during a second clock phase of the chopping clock signal $CLK_{CHOP}$, the switch control circuit 554 can close the first and third switches 553a, 553c and open the second and fourth switches 553b, 553d.

The chopping circuit 550 illustrates one example of a chopping circuit suitable for use as input chopping circuit, an output chopping circuit, or a feedback-path chopping circuit of the amplifiers described herein. However, other configurations of chopping circuits can be used, including, for example, switches that provide control over not only chopping operations, but other operations of an amplifier as well, such as autozeroing operations.

Applications

Devices employing the above described amplification schemes can be implemented into various electronic devices. Examples of the electronic devices can include, but are not limited to, medical imaging and monitoring, consumer electronic products, parts of the consumer electronic products, electronic test equipment, etc. Examples of the electronic devices can also include memory chips, memory modules, circuits of optical networks or other communication networks, and disk driver circuits. The consumer electronic products can include, but are not limited to, a mobile phone, a telephone, a television, a computer monitor, a computer, a hand-held computer, a personal digital assistant (PDA), a microwave, a refrigerator, an automobile, a stereo system, a cassette recorder or player, a DVD player, a CD player, a VCR, an MP3 player, a radio, a camcorder, a camera, a digital camera, a portable memory chip, a washer, a dryer, a washer/dryer, a copier, a facsimile machine, a scanner, a multi functional peripheral device, a wrist watch, a clock, etc. Further, the electronic device can include unfinished products.

The foregoing description and claims may refer to elements or features as being "connected" or "coupled" together. As used herein, unless expressly stated otherwise, "connected" means that one element/feature is directly or indirectly connected to another element/feature, and not necessarily mechanically. Likewise, unless expressly stated otherwise, "coupled" means that one element/feature is directly or indirectly coupled to another element/feature, and not necessarily mechanically. Thus, although the various schematics shown in the figures depict example arrangements of elements and components, additional intervening elements, devices, features, or components may be present in an actual embodiment (assuming that the functionality of the depicted circuits is not adversely affected).

Although this invention has been described in terms of certain embodiments, other embodiments that are apparent to those of ordinary skill in the art, including embodiments that do not provide all of the features and advantages set forth herein, are also within the scope of this invention. Moreover, the various embodiments described above can be combined to provide further embodiments. In addition, certain features shown in the context of one embodiment can be incorporated into other embodiments as well. Accordingly, the scope of the present invention is defined only by reference to the appended claims.

What is claimed is:

1. An amplifier comprising:
amplification circuitry configured to generate an output signal based on amplifying a differential input voltage signal;
chopping circuitry configured to provide chopping to the differential input voltage signal; and
a feedback offset correction circuit comprising:
a chopping ripple detection circuit configured to generate a detected ripple signal based on detecting a chopping ripple of the amplifier associated with the chopping;
a feedback-path chopping circuit configured to generate a demodulated ripple signal based on chopping the detected ripple signal;
a digital correction control circuit configured to generate a digital correction control signal based on the demodulated ripple signal, wherein the digital correction control circuit is controlled by a control clock signal having a frequency that changes with an operating mode of the amplifier; and
an offset correction circuit configured to correct for an input offset voltage of the amplification circuitry based on a value of the digital correction control signal.

2. An amplifier comprising:
amplification circuitry configured to generate an output signal based on amplifying a differential input voltage signal;
chopping circuitry configured to provide chopping to the differential input voltage signal; and
a feedback offset correction circuit comprising:
a chopping ripple detection circuit configured to generate a detected ripple signal based on detecting a chopping ripple of the amplifier associated with the chopping, wherein the chopping ripple detection circuit comprises one or more AC-coupling capacitors and a transconductance amplification stage, wherein the AC-coupling capacitors are configured to provide coupling of the chopping ripple to an input of the transconductance amplification stage;
a feedback-path chopping circuit configured to generate a demodulated ripple signal based on chopping the detected ripple signal;
a digital correction control circuit configured to generate a digital correction control signal based on the demodulated ripple signal, wherein the digital correction control circuit is controlled by a control clock signal; and
an offset correction circuit configured to correct for an input offset voltage of the amplification circuitry based on a value of the digital correction control signal.

3. The amplifier of claim 1, wherein the feedback offset correction circuit further comprises a clock rate control circuit configured to operate a frequency of the control clock signal at higher frequency in a calibration mode relative to a normal operating mode.

4. The amplifier of claim 3, further comprising a multiplexer configured to provide the differential input voltage signal to the amplification circuitry in the normal operating mode and to provide a differential input voltage of about 0 V to the amplification circuitry in the calibration mode.

5. The amplifier of claim 3, wherein the digital correction control circuit comprises a successive approximation register configured to operate during the calibration mode.

6. The amplifier of claim 1, further comprising a non-inverting input voltage terminal, an inverting input voltage terminal, and an output voltage terminal, wherein the amplifier is configured to receive the differential input voltage signal between the non-inverting input voltage terminal and the inverting input voltage terminal.

7. The amplifier of claim 6, further comprising a feedback circuit electrically connected between the output voltage terminal and the inverting input voltage terminal, wherein the chopping ripple detection circuit includes an input electrically connected to the inverting input voltage terminal.

8. The amplifier of claim 6, wherein the chopping ripple detection circuit includes an input electrically connected to the output voltage terminal.

9. The amplifier of claim 2 wherein the feedback offset correction circuit has a loop bandwidth of less than 100 Hz.

10. The amplifier of claim 1, wherein a frequency of the control clock signal is less than 100 Hz when the amplification circuitry is amplifying the differential input voltage signal such that the feedback offset correction circuit operates with narrow bandwidth.

11. The amplifier of claim 2 wherein the offset correction circuit comprises a current-steering digital-to-analog converter (DAC), wherein the amplification circuitry comprises an input transistor differential pair including a first transistor and a second transistor, wherein the current-steering DAC is configured to adjust a bias current of the first transistor relative to a bias current of the second transistor based on the value of the digital correction control signal.

12. The amplifier of claim 2 wherein the offset correction circuit comprises a voltage DAC, wherein the amplification circuitry comprises an input amplification stage and an auxiliary amplification stage electrically connected in parallel with one another, wherein the voltage DAC is configured to control an input voltage to the auxiliary amplification stage based on the value of the digital correction control signal.

13. The amplifier of claim 2 wherein the digital correction control circuit comprises a counter configured to control the value of the digital correction control signal and a comparator configured to control an input to the counter based on the demodulated ripple signal.

14. The amplifier of claim 2 wherein the chopping circuitry comprises an input chopping circuit and an output chopping circuit, wherein at least one amplification stage of the amplification circuitry is electrically connected between the input chopping circuit and the output chopping circuit.

15. The amplifier of claim 2, further comprising a feedback circuit electrically connected between an output voltage terminal and an inverting input voltage terminal of the amplifier, wherein the chopping ripple detection circuit includes an input electrically connected to the inverting input voltage terminal.

16. A method of input offset correction for a chopper amplifier, the method comprising:

amplifying a differential input voltage signal using amplification circuitry;
chopping the differential input voltage signal using chopping circuitry;
generating a detected ripple signal based on detecting a chopping ripple associated with the chopping;
generating a demodulated ripple signal based on demodulating the detected ripple signal;
generating a digital correction control signal based on the demodulated ripple signal and a control clock signal;
correcting an input offset voltage of the amplification circuitry based on a value of the digital correction control signal; and
changing a frequency of the control clock signal based on an operating mode of the chopper amplifier.

17. The method of claim 16, further comprising operating a frequency of the control clock signal at less than 100 Hz when amplifying the differential input voltage signal.

18. The method of claim 16, further comprising correcting the input offset voltage of the amplification circuitry using a loop bandwidth of less than 100 Hz.

19. The method of claim 16, further comprising operating a frequency of the control clock signal at a higher frequency in a calibration mode of the chopper amplifier relative to a normal operating mode of the chopper amplifier.

20. The method of claim 16, further comprising:
integrating the demodulated ripple signal to generate an integrated signal;
performing a plurality of comparison operations on the integrated signal using a comparator; and
generating the digital correction control signal by controlling a counter based on the comparison operations.

* * * * *